(12) United States Patent
Chen et al.

(10) Patent No.: US 8,713,400 B2
(45) Date of Patent: *Apr. 29, 2014

(54) METHOD AND SYSTEM FOR REDUCTION OF DECODING COMPLEXITY IN A COMMUNICATION SYSTEM

(75) Inventors: Tao Chen, La Jolla, CA (US); Paul E. Bender, San Diego, CA (US); Parag A. Agashe, San Diego, CA (US); Ramin Rezaiifar, San Diego, CA (US); Rajesh K. Pankaj, San Diego, CA (US); Yongbin Wei, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 570 days.

This patent is subject to a terminal disclaimer.

(21) Appl. No.: 12/683,256

(22) Filed: Jan. 6, 2010

(65) Prior Publication Data

US 2010/0107041 A1 Apr. 29, 2010

Related U.S. Application Data

(63) Continuation of application No. 09/976,591, filed on Oct. 12, 2001, now Pat. No. 7,649,829.

(51) Int. Cl.
*H03M 13/29* (2006.01)
(52) U.S. Cl.
USPC .......................................... 714/755; 714/786
(58) Field of Classification Search
USPC .................................................. 714/755, 786
See application file for complete search history.

(56) References Cited

U.S. PATENT DOCUMENTS

| | | | |
|---|---|---|---|
| 4,163,255 A | 7/1979 | Pires et al. | |
| 4,323,921 A | 4/1982 | Guillou et al. | |
| 4,336,612 A | * 6/1982 | Inoue et al. | 714/755 |
| 4,750,167 A | 6/1988 | Meyer et al. | |
| 4,870,408 A | 9/1989 | Zdunek et al. | |
| 4,881,263 A | 11/1989 | Herbison et al. | |

(Continued)

FOREIGN PATENT DOCUMENTS

| | | |
|---|---|---|
| CA | 2308405 A1 | 11/2000 |
| CN | 1256599 A | 6/2000 |

(Continued)

OTHER PUBLICATIONS

"Functional Model of a Conditional Access System", EBU Review—Technical European Broadcasting Union, Bussels, BE, No. 266; Dec. 21, 1995; pp. 64-77; XP000559450.

(Continued)

*Primary Examiner* — Guy Lamarre
(74) *Attorney, Agent, or Firm* — S. Hossain Beladi

(57) ABSTRACT

Method and System for Utilization of an Outer Decoder in a Broadcast Services Communication System is described. Information to be transmitted is provided to a systematic portion of a plurality of transmit buffers and encoded by an outer decoder communicatively coupled to the transmit buffer. The resulting redundant bits are provided to a parity portion of each transmit buffer. The content of the transmit buffers, is multiplexed and encoded by an inner decoder to improve protection by adding redundancy. The receiving station recovers the transmitted information by an inverse process. Because a decoding complexity depends on the size of a systematic portion of the transmit buffer, reasoned compromise between a systematic portion size and number of transmit buffers yields decreased decoding complexity.

42 Claims, 3 Drawing Sheets

(56) References Cited

U.S. PATENT DOCUMENTS

| | | |
|---|---|---|
| 4,901,307 A | 2/1990 | Gilhousen et al. |
| RE33,189 E | 3/1990 | Lee et al. |
| 4,924,513 A | 5/1990 | Herbison et al. |
| 5,052,000 A * | 9/1991 | Wang et al. .................... 714/758 |
| 5,056,109 A | 10/1991 | Gilhousen et al. |
| 5,101,501 A | 3/1992 | Gilhousen et al. |
| 5,103,459 A | 4/1992 | Gilhousen et al. |
| 5,117,457 A | 5/1992 | Comerford et al. |
| 5,136,586 A | 8/1992 | Greenblatt et al. |
| 5,150,412 A | 9/1992 | Maru et al. |
| 5,159,447 A | 10/1992 | Haskell et al. |
| 5,164,988 A | 11/1992 | Matyas et al. |
| 5,235,631 A | 8/1993 | Grube et al. |
| 5,237,612 A | 8/1993 | Raith |
| 5,241,598 A | 8/1993 | Raith |
| 5,253,294 A | 10/1993 | Maurer et al. |
| 5,257,396 A | 10/1993 | Auld, Jr. et al. |
| 5,325,357 A | 6/1994 | Kimoto et al. |
| 5,351,087 A | 9/1994 | Christopher et al. |
| 5,353,332 A | 10/1994 | Raith et al. |
| 5,363,379 A | 11/1994 | Eckenrode et al. |
| 5,365,572 A | 11/1994 | Saegusa et al. |
| 5,369,784 A | 11/1994 | Nelson et al. |
| 5,371,794 A | 12/1994 | Diffie et al. |
| 5,404,563 A | 4/1995 | Green et al. |
| 5,410,602 A | 4/1995 | Finkelstein et al. |
| 5,412,655 A | 5/1995 | Yamada et al. |
| 5,421,006 A | 5/1995 | Jablon et al. |
| 5,442,626 A * | 8/1995 | Wei .............................. 370/207 |
| 5,448,568 A | 9/1995 | Delpuch et al. |
| 5,467,398 A | 11/1995 | Pierce et al. |
| 5,473,609 A | 12/1995 | Chaney et al. |
| 5,473,642 A | 12/1995 | Osawa et al. |
| 5,481,613 A | 1/1996 | Ford et al. |
| 5,485,577 A | 1/1996 | Eyer et al. |
| 5,504,773 A | 4/1996 | Padovani et al. |
| 5,513,245 A | 4/1996 | Mizikovsky et al. |
| 5,515,441 A | 5/1996 | Faucher et al. |
| 5,537,474 A | 7/1996 | Brown et al. |
| 5,565,909 A | 10/1996 | Thibadeau et al. |
| 5,592,470 A | 1/1997 | Rudrapatna et al. |
| 5,659,556 A | 8/1997 | Denissen et al. |
| 5,673,259 A | 9/1997 | Quick, Jr. et al. |
| 5,686,963 A | 11/1997 | Uz et al. |
| 5,708,961 A | 1/1998 | Hylton et al. |
| 5,729,540 A | 3/1998 | Wegrzyn et al. |
| 5,740,246 A | 4/1998 | Saito |
| 5,748,736 A | 5/1998 | Mittra |
| 5,751,707 A | 5/1998 | Voit et al. |
| 5,751,725 A | 5/1998 | Chen et al. |
| 5,758,068 A | 5/1998 | Brandt et al. |
| 5,758,291 A | 5/1998 | Grube et al. |
| 5,768,276 A | 6/1998 | Diachina et al. |
| 5,774,496 A | 6/1998 | Butler et al. |
| 5,778,059 A | 7/1998 | Loghmani et al. |
| 5,778,069 A | 7/1998 | Thomlinson et al. |
| 5,778,187 A | 7/1998 | Monteiro et al. |
| 5,787,347 A | 7/1998 | Yu et al. |
| 5,796,829 A | 8/1998 | Newby et al. |
| 5,835,730 A | 11/1998 | Grossman et al. |
| 5,850,444 A | 12/1998 | Rune et al. |
| 5,850,445 A | 12/1998 | Chan et al. |
| 5,870,474 A | 2/1999 | Wasilewski et al. |
| 5,878,141 A | 3/1999 | Daly et al. |
| 5,881,368 A | 3/1999 | Grob et al. |
| 5,884,196 A | 3/1999 | Lekven et al. |
| 5,887,252 A | 3/1999 | Noneman et al. |
| 5,909,491 A | 6/1999 | Luo et al. |
| 5,923,649 A | 7/1999 | Raith et al. |
| 5,936,965 A | 8/1999 | Doshi et al. |
| 5,940,507 A | 8/1999 | Cane et al. |
| 5,946,316 A | 8/1999 | Chen et al. |
| 5,956,404 A | 9/1999 | Schneier et al. |
| 5,956,681 A | 9/1999 | Yamakita et al. |
| 5,970,072 A | 10/1999 | Gammenthaler, Jr. et al. |
| 5,970,417 A | 10/1999 | Toyryla et al. |
| 5,978,386 A | 11/1999 | Hamalainen et al. |
| 5,983,099 A | 11/1999 | Yao et al. |
| 5,983,388 A * | 11/1999 | Friedman et al. ............. 714/776 |
| 5,990,928 A | 11/1999 | Sklar et al. |
| 5,991,400 A | 11/1999 | Kamperman et al. |
| 5,991,407 A | 11/1999 | Murto et al. |
| 6,006,073 A | 12/1999 | Glauner et al. |
| 6,014,765 A | 1/2000 | Maeda et al. |
| 6,018,360 A | 1/2000 | Stewart et al. |
| 6,021,124 A | 2/2000 | Haartsen et al. |
| 6,026,165 A | 2/2000 | Marino et al. |
| 6,032,197 A | 2/2000 | Birdwell et al. |
| 6,044,154 A | 3/2000 | Kelly et al. |
| 6,047,071 A | 4/2000 | Shah et al. |
| 6,047,395 A | 4/2000 | Zook et al. |
| 6,052,812 A | 4/2000 | Chen et al. |
| 6,055,236 A | 4/2000 | Nessett et al. |
| 6,055,314 A | 4/2000 | Spies et al. |
| 6,058,289 A | 5/2000 | Gardner et al. |
| 6,065,061 A | 5/2000 | Blahut et al. |
| 6,067,290 A | 5/2000 | Paulraj et al. |
| 6,073,122 A | 6/2000 | Wool et al. |
| 6,081,907 A | 6/2000 | Witty et al. |
| 6,097,817 A | 8/2000 | Bilgic et al. |
| 6,098,878 A | 8/2000 | Dent et al. |
| 6,108,424 A | 8/2000 | Pitiot et al. |
| 6,108,706 A | 8/2000 | Birdwell et al. |
| 6,111,866 A | 8/2000 | Kweon et al. |
| 6,122,763 A * | 9/2000 | Pyndiah et al. ................ 714/755 |
| 6,128,389 A | 10/2000 | Chan et al. |
| 6,128,490 A | 10/2000 | Shaheen et al. |
| 6,148,010 A | 11/2000 | Sutton et al. |
| 6,157,719 A | 12/2000 | Wasilewski et al. |
| 6,172,972 B1 | 1/2001 | Birdwell et al. |
| 6,185,430 B1 | 2/2001 | Yee et al. |
| 6,195,546 B1 | 2/2001 | Leung et al. |
| 6,199,161 B1 | 3/2001 | Ahvenainen et al. |
| 6,201,961 B1 | 3/2001 | Schindall et al. |
| 6,208,634 B1 | 3/2001 | Boulos et al. |
| 6,230,024 B1 | 5/2001 | Wang et al. |
| 6,233,234 B1 | 5/2001 | Curry et al. |
| 6,233,341 B1 | 5/2001 | Riggins et al. |
| 6,240,091 B1 | 5/2001 | Ginzboorg et al. |
| 6,253,069 B1 | 6/2001 | Mankovitz et al. |
| 6,253,326 B1 | 6/2001 | Lincke et al. |
| 6,256,509 B1 | 7/2001 | Tanaka et al. |
| 6,266,420 B1 | 7/2001 | Langford et al. |
| 6,272,632 B1 | 8/2001 | Carman et al. |
| 6,295,361 B1 | 9/2001 | Kadansky et al. |
| 6,310,661 B1 | 10/2001 | Arsenault et al. |
| 6,314,095 B1 | 11/2001 | Loa et al. |
| 6,343,280 B2 | 1/2002 | Clark et al. |
| 6,345,307 B1 | 2/2002 | Booth et al. |
| 6,353,614 B1 | 3/2002 | Borella et al. |
| 6,363,242 B1 | 3/2002 | Brown, Jr. et al. |
| 6,363,480 B1 | 3/2002 | Perlman et al. |
| 6,366,776 B1 | 4/2002 | Wright et al. |
| 6,373,829 B1 | 4/2002 | Vilmur et al. |
| 6,374,103 B1 | 4/2002 | Kamel et al. |
| 6,377,810 B1 | 4/2002 | Geiger et al. |
| 6,385,200 B1 | 5/2002 | Erami et al. |
| 6,385,461 B1 | 5/2002 | Raith et al. |
| 6,415,312 B1 | 7/2002 | Boivie |
| 6,424,717 B1 | 7/2002 | Pinder et al. |
| 6,424,947 B1 | 7/2002 | Tsuria et al. |
| 6,434,367 B1 | 8/2002 | Kumar et al. |
| 6,438,612 B1 | 8/2002 | Ylonen et al. |
| 6,449,491 B1 | 9/2002 | Dailey et al. |
| 6,460,156 B1 * | 10/2002 | Laukkanen et al. .......... 714/755 |
| 6,463,155 B1 | 10/2002 | Akiyama et al. |
| 6,473,419 B1 | 10/2002 | Gray et al. |
| 6,473,858 B1 | 10/2002 | Shimomura et al. |
| 6,477,377 B2 | 11/2002 | Backstrom et al. |
| 6,490,259 B1 | 12/2002 | Agrawal et al. |
| 6,502,140 B1 | 12/2002 | Boivie |
| 6,507,590 B1 | 1/2003 | Terho et al. |
| 6,510,515 B1 | 1/2003 | Raith et al. |
| RE38,007 E | 2/2003 | Tsukamoto et al. |

(56) References Cited

U.S. PATENT DOCUMENTS

| | | |
|---|---|---|
| 6,519,266 B1 | 2/2003 | Manning et al. |
| 6,523,069 B1 | 2/2003 | Luczycki et al. |
| 6,529,740 B1 | 3/2003 | Ganucheau, Jr. et al. |
| 6,536,041 B1 | 3/2003 | Knudson et al. |
| 6,538,996 B1 | 3/2003 | West et al. |
| 6,539,242 B1 | 3/2003 | Bayley |
| 6,542,490 B1 | 4/2003 | Ahmadvand et al. |
| 6,542,504 B1 | 4/2003 | Mahler et al. |
| 6,549,771 B2 | 4/2003 | Chang et al. |
| 6,560,206 B1 | 5/2003 | Naden et al. |
| 6,564,211 B1 | 5/2003 | Andreev et al. |
| 6,567,914 B1 | 5/2003 | Just et al. |
| 6,571,109 B1 | 5/2003 | Kim et al. |
| 6,574,211 B2 | 6/2003 | Padovani et al. |
| 6,577,734 B1 | 6/2003 | Etzel et al. |
| 6,577,848 B1 | 6/2003 | Gregg et al. |
| 6,580,756 B1 | 6/2003 | Matsui et al. |
| 6,598,203 B1 | 7/2003 | Tang et al. |
| 6,600,745 B1 | 7/2003 | Chopping et al. |
| 6,601,068 B1 | 7/2003 | Park et al. |
| 6,603,857 B1 | 8/2003 | Batten-Carew et al. |
| 6,606,706 B1 | 8/2003 | Li et al. |
| 6,608,841 B1 | 8/2003 | Koodli et al. |
| 6,614,804 B1 | 9/2003 | McFadden et al. |
| 6,633,979 B1 | 10/2003 | Smeets et al. |
| 6,640,094 B1 | 10/2003 | Tabeta |
| 6,647,000 B1 | 11/2003 | Persson et al. |
| 6,654,384 B1 | 11/2003 | Reza et al. |
| 6,658,463 B1 | 12/2003 | Dillon et al. |
| 6,658,605 B1 * | 12/2003 | Yoshida et al. ............... 714/702 |
| 6,665,718 B1 | 12/2003 | Chuah et al. |
| 6,678,856 B1 * | 1/2004 | Jordan et al. .................. 714/755 |
| 6,680,920 B1 | 1/2004 | Wan et al. |
| 6,690,795 B1 | 2/2004 | Richards et al. |
| 6,704,368 B1 | 3/2004 | Nefedov et al. |
| 6,704,369 B1 | 3/2004 | Kawasaki et al. |
| 6,707,801 B2 | 3/2004 | Hsu |
| 6,711,182 B1 | 3/2004 | Gibbs et al. |
| 6,714,650 B1 | 3/2004 | Maillard et al. |
| 6,714,784 B1 | 3/2004 | Forssell et al. |
| 6,721,805 B1 | 4/2004 | Bhagwat et al. |
| 6,725,459 B2 | 4/2004 | Bacon et al. |
| 6,728,226 B1 | 4/2004 | Naito |
| 6,731,936 B2 | 5/2004 | Chen et al. |
| 6,735,177 B1 | 5/2004 | Suzuki et al. |
| 6,735,190 B1 | 5/2004 | Chuah et al. |
| 6,738,942 B1 * | 5/2004 | Sridharan et al. ............. 714/755 |
| 6,751,218 B1 | 6/2004 | Hagirahim et al. |
| 6,760,602 B2 | 7/2004 | Tangorra et al. |
| 6,760,752 B1 | 7/2004 | Liu et al. |
| 6,763,025 B2 | 7/2004 | Leatherbury et al. |
| 6,765,909 B1 | 7/2004 | Sen et al. |
| 6,766,024 B1 | 7/2004 | Rix et al. |
| 6,775,303 B1 | 8/2004 | Rustad et al. |
| 6,781,999 B2 | 8/2004 | Eyuboglu et al. |
| 6,788,681 B1 | 9/2004 | Hurren et al. |
| 6,792,048 B1 | 9/2004 | Lee et al. |
| 6,798,791 B1 | 9/2004 | Riazi et al. |
| 6,801,508 B1 | 10/2004 | Lim et al. |
| 6,804,520 B1 | 10/2004 | Johansson et al. |
| 6,810,499 B2 * | 10/2004 | Sridharan et al. ............. 714/755 |
| 6,819,930 B1 | 11/2004 | Laroia et al. |
| 6,826,406 B1 | 11/2004 | Vialen et al. |
| 6,829,741 B1 * | 12/2004 | Khansari et al. ............. 714/755 |
| 6,831,910 B1 | 12/2004 | Moon et al. |
| 6,832,314 B1 | 12/2004 | Irvin et al. |
| 6,856,800 B1 | 2/2005 | Henry et al. |
| 6,862,684 B1 | 3/2005 | DiGiorgio |
| 6,870,923 B2 | 3/2005 | Yi et al. |
| 6,879,573 B1 | 4/2005 | Huo et al. |
| 6,879,690 B2 | 4/2005 | Faccin et al. |
| 6,882,850 B2 | 4/2005 | McConnell et al. |
| 6,882,860 B1 | 4/2005 | Kim et al. |
| 6,885,874 B2 | 4/2005 | Grube et al. |
| 6,888,899 B2 * | 5/2005 | Raleigh et al. ............... 375/299 |
| 6,895,216 B2 | 5/2005 | Sato et al. |
| 6,895,546 B2 * | 5/2005 | Ivry ............................... 714/784 |
| 6,898,285 B1 | 5/2005 | Hutchings et al. |
| 6,898,640 B1 | 5/2005 | Kurita et al. |
| 6,909,702 B2 | 6/2005 | Leung et al. |
| 6,915,272 B1 | 7/2005 | Zilliacus et al. |
| 6,918,035 B1 | 7/2005 | Patel et al. |
| 6,920,119 B2 | 7/2005 | Rinchiuso |
| 6,925,285 B2 | 8/2005 | Kim et al. |
| 6,944,763 B1 | 9/2005 | Asano et al. |
| 6,952,454 B1 * | 10/2005 | Jalali et al. .................... 375/260 |
| 6,956,833 B1 | 10/2005 | Yukie et al. |
| 6,959,384 B1 | 10/2005 | Serret-Avila |
| 6,963,544 B1 | 11/2005 | Balachandran et al. |
| 6,970,689 B2 | 11/2005 | Khorram |
| 6,978,143 B1 | 12/2005 | Vialen |
| 6,983,410 B2 | 1/2006 | Chen et al. |
| 6,987,982 B2 | 1/2006 | Willenegger et al. |
| 6,990,680 B1 | 1/2006 | Wugofski et al. |
| 7,016,351 B1 | 3/2006 | Farinacci et al. |
| 7,024,616 B2 * | 4/2006 | Ohira et al. ................... 714/786 |
| 7,031,666 B2 | 4/2006 | Hsu |
| 7,036,023 B2 | 4/2006 | Fries et al. |
| 7,039,180 B1 | 5/2006 | Issaa et al. |
| 7,046,672 B2 | 5/2006 | Liao et al. |
| 7,058,809 B2 | 6/2006 | White |
| 7,069,436 B1 | 6/2006 | Akachi |
| 7,072,865 B2 | 7/2006 | Akiyama et al. |
| 7,079,502 B2 | 7/2006 | Yamano et al. |
| 7,079,523 B2 | 7/2006 | Nelson, Jr. et al. |
| 7,096,355 B1 | 8/2006 | Marvit et al. |
| 7,114,175 B2 | 9/2006 | Lahteenmaki et al. |
| 7,116,892 B2 | 10/2006 | Wajs |
| 7,133,353 B2 | 11/2006 | Sourour et al. |
| 7,134,019 B2 | 11/2006 | Shelest et al. |
| 7,177,424 B1 | 2/2007 | Furuya et al. |
| 7,181,620 B1 | 2/2007 | Hur |
| 7,185,362 B2 | 2/2007 | Hawkes et al. |
| 7,197,072 B1 | 3/2007 | Hsu et al. |
| 7,200,230 B2 | 4/2007 | Knauft et al. |
| 7,203,314 B1 | 4/2007 | Kahn et al. |
| 7,209,459 B2 | 4/2007 | Kangas et al. |
| 7,215,775 B2 | 5/2007 | Noguchi et al. |
| 7,219,291 B2 * | 5/2007 | Adde et al. .................... 714/755 |
| 7,237,108 B2 | 6/2007 | Medvinsky et al. |
| 7,239,704 B1 | 7/2007 | Maillard et al. |
| 7,266,687 B2 | 9/2007 | Sowa et al. |
| 7,278,164 B2 | 10/2007 | Raiz et al. |
| 7,280,660 B2 | 10/2007 | Salo et al. |
| 7,290,063 B2 | 10/2007 | Kalliokulju et al. |
| 7,301,968 B2 | 11/2007 | Haran et al. |
| 7,308,100 B2 | 12/2007 | Bender et al. |
| 7,349,425 B2 | 3/2008 | Leung et al. |
| 7,352,868 B2 | 4/2008 | Hawkes et al. |
| 7,376,963 B2 | 5/2008 | Kato et al. |
| 7,649,829 B2 * | 1/2010 | Chen et al. .................... 370/203 |
| 7,669,104 B2 * | 2/2010 | Uchida et al. ................. 714/755 |
| 7,693,508 B2 | 4/2010 | Leung et al. |
| 7,697,523 B2 | 4/2010 | Leung et al. |
| 2001/0004761 A1 | 6/2001 | Zehavi et al. |
| 2001/0029581 A1 | 10/2001 | Knauft et al. |
| 2001/0034254 A1 | 10/2001 | Ranta et al. |
| 2001/0036200 A1 | 11/2001 | Nelson et al. |
| 2001/0036834 A1 | 11/2001 | Das et al. |
| 2001/0055298 A1 | 12/2001 | Baker et al. |
| 2002/0001386 A1 | 1/2002 | Akiyama et al. |
| 2002/0002541 A1 | 1/2002 | Williams et al. |
| 2002/0002674 A1 | 1/2002 | Grimes et al. |
| 2002/0010681 A1 | 1/2002 | Hillegass et al. |
| 2002/0014159 A1 | 2/2002 | Tatsumi et al. |
| 2002/0021809 A1 | 2/2002 | Salo et al. |
| 2002/0023165 A1 | 2/2002 | Lahr et al. |
| 2002/0071558 A1 | 6/2002 | Patel |
| 2002/0076195 A1 | 6/2002 | Nakajima et al. |
| 2002/0080887 A1 | 6/2002 | Jeong et al. |
| 2002/0091860 A1 | 7/2002 | Kalliokulju et al. |
| 2002/0091931 A1 | 7/2002 | Quick, Jr. et al. |
| 2002/0097722 A1 | 7/2002 | Liao et al. |
| 2002/0099949 A1 | 7/2002 | Fries et al. |

(56) References Cited

U.S. PATENT DOCUMENTS

| | | |
|---|---|---|
| 2002/0102964 A1 | 8/2002 | Park |
| 2002/0112234 A1 | 8/2002 | Bacon et al. |
| 2002/0141371 A1 | 10/2002 | Hsu |
| 2002/0141591 A1 | 10/2002 | Hawkes et al. |
| 2002/0152384 A1 | 10/2002 | Shelest et al. |
| 2002/0154781 A1 | 10/2002 | Sowa et al. |
| 2002/0164025 A1 | 11/2002 | Raiz et al. |
| 2002/0169724 A1 | 11/2002 | Moroney et al. |
| 2002/0176408 A1 | 11/2002 | Kangas et al. |
| 2002/0181423 A1 | 12/2002 | Chen et al. |
| 2003/0009669 A1 | 1/2003 | White et al. |
| 2003/0014685 A1 | 1/2003 | Chong et al. |
| 2003/0018891 A1 | 1/2003 | Hall et al. |
| 2003/0030581 A1 | 2/2003 | Roy |
| 2003/0031322 A1 | 2/2003 | Beckmann et al. |
| 2003/0035389 A1 | 2/2003 | Chen et al. |
| 2003/0039237 A1 | 2/2003 | Forslow et al. |
| 2003/0039361 A1 | 2/2003 | Hawkes et al. |
| 2003/0054807 A1 | 3/2003 | Hsu et al. |
| 2003/0064679 A1 | 4/2003 | Kim et al. |
| 2003/0070092 A1 | 4/2003 | Hawkes et al. |
| 2003/0072384 A1 | 4/2003 | Chen et al. |
| 2003/0087653 A1 | 5/2003 | Leung et al. |
| 2003/0101401 A1 | 5/2003 | Salvi et al. |
| 2003/0123669 A1 | 7/2003 | Koukoulidis et al. |
| 2003/0126440 A1 | 7/2003 | Go et al. |
| 2003/0134655 A1 | 7/2003 | Chen et al. |
| 2003/0135748 A1 | 7/2003 | Yamada et al. |
| 2003/0157952 A1 | 8/2003 | Sarkkinen et al. |
| 2003/0159029 A1 | 8/2003 | Brown et al. |
| 2003/0217057 A1 | 11/2003 | Kuroiwa et al. |
| 2004/0005860 A1 | 1/2004 | Kato et al. |
| 2004/0019787 A1 | 1/2004 | Shibata et al. |
| 2004/0022216 A1 | 2/2004 | Shi et al. |
| 2004/0095515 A1 | 5/2004 | Tajima et al. |
| 2004/0101138 A1 | 5/2004 | Revital et al. |
| 2004/0107350 A1 | 6/2004 | Wasilewski et al. |
| 2004/0120527 A1 | 6/2004 | Hawkes et al. |
| 2004/0131185 A1 | 7/2004 | Kakumer et al. |
| 2004/0132402 A1 | 7/2004 | Agashe et al. |
| 2004/0151317 A1 | 8/2004 | Hyyppa et al. |
| 2004/0199474 A1 | 10/2004 | Ritter |
| 2004/0202329 A1 | 10/2004 | Jung et al. |
| 2004/0243808 A1 | 12/2004 | Ishiguro et al. |
| 2004/0266391 A1 | 12/2004 | Hafren et al. |
| 2005/0008159 A1 | 1/2005 | Grilli et al. |
| 2005/0010774 A1 | 1/2005 | Rose et al. |
| 2005/0048963 A1 | 3/2005 | Kubler et al. |
| 2005/0055551 A1 | 3/2005 | Becker et al. |
| 2005/0063544 A1 | 3/2005 | Uusitalo et al. |
| 2005/0108563 A1 | 5/2005 | Becker et al. |
| 2005/0138379 A1 | 6/2005 | Semple et al. |
| 2005/0144550 A1 | 6/2005 | Jeon et al. |
| 2005/0165711 A1 | 7/2005 | Hamatsu |
| 2005/0216731 A1 | 9/2005 | Saito et al. |
| 2005/0238315 A1 | 10/2005 | Kataoka |
| 2005/0271210 A1 | 12/2005 | Soppera et al. |
| 2006/0078000 A1 | 4/2006 | Rinne et al. |
| 2006/0168446 A1 | 7/2006 | Ahonen et al. |
| 2006/0171540 A1 | 8/2006 | Lee et al. |
| 2006/0242412 A1 | 10/2006 | Jung et al. |
| 2007/0038610 A1 | 2/2007 | Omoigui et al. |
| 2007/0116282 A1 | 5/2007 | Hawkes et al. |
| 2007/0214482 A1 | 9/2007 | Nguyen et al. |
| 2007/0280169 A1 | 12/2007 | Cam Winget |
| 2008/0226073 A1 | 9/2008 | Hawkes et al. |
| 2010/0048206 A1 | 2/2010 | Agashe et al. |
| 2010/0142432 A1 | 6/2010 | Leung et al. |
| 2010/0272124 A1 | 10/2010 | Chen et al. |
| 2011/0045864 A1 | 2/2011 | Chen et al. |

FOREIGN PATENT DOCUMENTS

| | | |
|---|---|---|
| CN | 1281561 A | 1/2001 |
| EP | 0636963 A2 | 2/1995 |
| EP | 0702477 A2 | 3/1996 |
| EP | 0748058 A2 | 12/1996 |
| EP | 0813309 A2 | 12/1997 |
| EP | 0854618 A2 | 7/1998 |
| EP | 0924898 A1 | 6/1999 |
| EP | 0928084 A2 | 7/1999 |
| EP | 0951198 A2 | 10/1999 |
| EP | 0993128 A1 | 4/2000 |
| EP | 0999656 A1 | 5/2000 |
| EP | 1001570 A2 | 5/2000 |
| EP | 1024661 A2 | 8/2000 |
| EP | 1030484 A2 | 8/2000 |
| EP | 1032150 A2 | 8/2000 |
| EP | 1071296 A1 | 1/2001 |
| EP | 1075118 A2 | 2/2001 |
| EP | 1075123 A1 | 2/2001 |
| EP | 1098446 A2 | 5/2001 |
| EP | 1117204 A2 | 7/2001 |
| EP | 1134951 A2 | 9/2001 |
| EP | 1143635 A1 | 10/2001 |
| EP | 1185125 A1 | 3/2002 |
| EP | 1190526 A1 | 3/2002 |
| EP | 1213943 A1 | 6/2002 |
| EP | 1248188 A1 | 10/2002 |
| EP | 1374477 A1 | 10/2002 |
| EP | 2204940 | 7/2010 |
| GB | 2346512 A | 8/2000 |
| JP | 1101042 | 4/1989 |
| JP | 02090840 | 3/1990 |
| JP | 03179841 | 5/1991 |
| JP | 5216411 A | 8/1993 |
| JP | 06125554 | 5/1994 |
| JP | 7115414 | 5/1995 |
| JP | 7193569 | 7/1995 |
| JP | 7288798 | 10/1995 |
| JP | 9135478 A | 5/1997 |
| JP | 9331314 A | 12/1997 |
| JP | 10023529 A | 1/1998 |
| JP | 10051380 A | 2/1998 |
| JP | 10063598 A | 3/1998 |
| JP | 10093547 | 4/1998 |
| JP | 10093547 A | 4/1998 |
| JP | 10191459 | 7/1998 |
| JP | 10200536 A | 7/1998 |
| JP | 10214233 | 8/1998 |
| JP | 10240826 | 11/1998 |
| JP | 10512428 | 11/1998 |
| JP | 11110401 A | 4/1999 |
| JP | 11127468 | 5/1999 |
| JP | 11136669 A | 5/1999 |
| JP | 11161167 | 6/1999 |
| JP | 11243569 A | 9/1999 |
| JP | 11510668 T | 9/1999 |
| JP | 11313059 A | 11/1999 |
| JP | 11331070 A | 11/1999 |
| JP | 11331150 A | 11/1999 |
| JP | 11513853 | 11/1999 |
| JP | 11345179 A | 12/1999 |
| JP | 11355460 A | 12/1999 |
| JP | 11355858 A | 12/1999 |
| JP | 2000040064 A | 2/2000 |
| JP | 2000078555 A | 3/2000 |
| JP | 2000115860 | 4/2000 |
| JP | 2000134193 | 5/2000 |
| JP | 2000137551 A | 5/2000 |
| JP | 2000138632 A | 5/2000 |
| JP | 2000165258 A | 6/2000 |
| JP | 2000183968 A | 6/2000 |
| JP | 2000196546 A | 7/2000 |
| JP | 2000196673 A | 7/2000 |
| JP | 2000224648 A | 8/2000 |
| JP | 2000244603 | 9/2000 |
| JP | 2000253065 A | 9/2000 |
| JP | 2000253459 A | 9/2000 |
| JP | 2000261374 A | 9/2000 |

(56) References Cited

FOREIGN PATENT DOCUMENTS

| | | |
|---|---|---|
| JP | 2000269959 | 9/2000 |
| JP | 2000511733 T | 9/2000 |
| JP | 000513519 | 10/2000 |
| JP | 2000287192 | 10/2000 |
| JP | 2000295541 | 10/2000 |
| JP | 2000324155 A | 11/2000 |
| JP | 2000349755 A | 12/2000 |
| JP | 2001007759 A | 1/2001 |
| JP | 2001007800 | 1/2001 |
| JP | 2001016179 A | 1/2001 |
| JP | 2001016253 A | 1/2001 |
| JP | 2001500327 | 1/2001 |
| JP | 200136941 | 2/2001 |
| JP | 2001036466 A | 2/2001 |
| JP | 2001045100 A | 2/2001 |
| JP | 2001053675 A | 2/2001 |
| JP | 2001077859 A | 3/2001 |
| JP | 2001119340 A | 4/2001 |
| JP | 2001134193 | 5/2001 |
| JP | 2001136507 A | 5/2001 |
| JP | 2001177513 A | 6/2001 |
| JP | 2001177523 A | 6/2001 |
| JP | 2001177564 A | 6/2001 |
| JP | 2001510970 | 8/2001 |
| JP | 2001512842 | 8/2001 |
| JP | 2001268535 A | 9/2001 |
| JP | 2001513587 | 9/2001 |
| JP | 2001333032 A | 11/2001 |
| JP | 2001522164 T | 11/2001 |
| JP | 2002026835 | 1/2002 |
| JP | 2002027417 | 1/2002 |
| JP | 2002502204 A | 1/2002 |
| JP | 2002064785 A | 2/2002 |
| JP | 2002505458 T | 2/2002 |
| JP | 2002506296 | 2/2002 |
| JP | 2002084470 A | 3/2002 |
| JP | 2002152194 | 5/2002 |
| JP | 2002514024 | 5/2002 |
| JP | 2002175505 | 6/2002 |
| JP | 2002521879 T | 7/2002 |
| JP | 2002216040 | 8/2002 |
| JP | 2002217894 | 8/2002 |
| JP | 2002232418 A | 8/2002 |
| JP | 2002232962 | 8/2002 |
| JP | 2002300152 | 10/2002 |
| JP | 2002319936 | 10/2002 |
| JP | 2002541685 | 12/2002 |
| JP | 2003503896 | 1/2003 |
| JP | 200352029 | 2/2003 |
| JP | 2003099327 A | 4/2003 |
| JP | 2003115832 | 4/2003 |
| JP | 2003124927 | 4/2003 |
| JP | 2003521843 T | 7/2003 |
| JP | 2003259284 A | 9/2003 |
| JP | 2003297015 A | 10/2003 |
| JP | 2003529963 | 10/2003 |
| JP | 2003339000 A | 11/2003 |
| JP | 2004048718 A | 2/2004 |
| JP | 200480663 | 3/2004 |
| JP | 2004507175 A | 3/2004 |
| JP | 2004532554 | 10/2004 |
| JP | 2004533174 | 10/2004 |
| JP | 2004343764 | 12/2004 |
| JP | 2005509367 | 4/2005 |
| JP | 2005512471 | 4/2005 |
| JP | 2005507572 | 5/2005 |
| JP | 2006518975 A | 8/2006 |
| KR | 20000062153 | 10/2000 |
| KR | 200130725 | 4/2001 |
| KR | 1020010030696 | 4/2001 |
| RU | 2073913 C1 | 2/1997 |
| RU | 2077113 C1 | 4/1997 |
| RU | 2091983 C1 | 9/1997 |
| RU | 2115249 C1 | 7/1998 |
| RU | 2147792 C1 | 4/2000 |
| RU | 2187205 C2 | 8/2002 |
| TW | 353841 | 3/1999 |
| TW | 373372 | 11/1999 |
| TW | 388158 | 4/2000 |
| TW | 420910 B | 2/2001 |
| TW | 448658 | 8/2001 |
| TW | 502190 | 9/2002 |
| TW | 508958 B | 11/2002 |
| WO | 8301881 A1 | 5/1983 |
| WO | WO8607224 A1 | 12/1986 |
| WO | WO9611538 A2 | 4/1996 |
| WO | WO9715161 A1 | 4/1997 |
| WO | 9716924 A1 | 5/1997 |
| WO | WO9716890 A2 | 5/1997 |
| WO | WO9717790 A1 | 5/1997 |
| WO | 9747094 | 12/1997 |
| WO | WO9748212 A1 | 12/1997 |
| WO | WO9810604 A1 | 3/1998 |
| WO | WO9825422 A1 | 6/1998 |
| WO | WO9857509 A2 | 12/1998 |
| WO | 9904583 A1 | 1/1999 |
| WO | WO9922466 A1 | 5/1999 |
| WO | WO9922478 A1 | 5/1999 |
| WO | WO9930234 A1 | 6/1999 |
| WO | 9939524 | 8/1999 |
| WO | 9949588 | 9/1999 |
| WO | 9949595 A1 | 9/1999 |
| WO | WO9944114 A1 | 9/1999 |
| WO | WO9959355 A2 | 11/1999 |
| WO | WO9962231 A1 | 12/1999 |
| WO | WO9966657 A1 | 12/1999 |
| WO | WO0002406 A2 | 1/2000 |
| WO | WO0004718 A1 | 1/2000 |
| WO | WO0008883 A1 | 2/2000 |
| WO | WO0013356 A1 | 3/2000 |
| WO | WO0033535 A1 | 6/2000 |
| WO | WO0036804 A1 | 6/2000 |
| WO | 0041364 A1 | 7/2000 |
| WO | WO0048358 | 8/2000 |
| WO | WO0051308 A2 | 8/2000 |
| WO | WO0052880 A2 | 9/2000 |
| WO | WO0056018 A1 | 9/2000 |
| WO | WO0057601 A1 | 9/2000 |
| WO | WO0062476 | 10/2000 |
| WO | WO0062547 A1 | 10/2000 |
| WO | WO0072609 A1 | 11/2000 |
| WO | 0074425 A1 | 12/2000 |
| WO | 0076234 A1 | 12/2000 |
| WO | WO0074311 | 12/2000 |
| WO | WO0076125 A1 | 12/2000 |
| WO | WO0078008 A1 | 12/2000 |
| WO | WO0079734 A1 | 12/2000 |
| WO | WO0101630 A1 | 1/2001 |
| WO | WO0110146 A1 | 2/2001 |
| WO | WO0113358 | 2/2001 |
| WO | WO0117163 | 3/2001 |
| WO | WO0119027 A2 | 3/2001 |
| WO | WO0120805 | 3/2001 |
| WO | WO0145443 | 6/2001 |
| WO | WO0150783 | 7/2001 |
| WO | WO0156232 | 8/2001 |
| WO | WO0208449 | 1/2002 |
| WO | 0215578 A1 | 2/2002 |
| WO | WO0247356 | 6/2002 |
| WO | WO0247407 A2 | 6/2002 |
| WO | WO02054663 A2 | 7/2002 |
| WO | WO02061572 A1 | 8/2002 |
| WO | WO02080449 A1 | 10/2002 |
| WO | WO02080454 A2 | 10/2002 |
| WO | WO02096150 | 11/2002 |
| WO | WO03001772 | 3/2003 |
| WO | WO03032573 A2 | 4/2003 |
| WO | 03043310 A1 | 5/2003 |
| WO | 03051056 A1 | 6/2003 |
| WO | WO03051072 | 6/2003 |
| WO | WO03063418 A1 | 7/2003 |
| WO | WO2004025895 A1 | 3/2004 |

(56) References Cited

FOREIGN PATENT DOCUMENTS

WO       WO2005008393          1/2005
WO        2009130589 A1       10/2009

OTHER PUBLICATIONS

"TIA/EIA/IS-95-B Mobile Station—Base Station Compatibility Standard for Dual-Mode Wideband Spread Spectrum Cellular System." (IS-95 Standard).
3G TS 25.213 V4.1.0 (Jun. 2001) 3rd Generation Partnership Project; Technical Specification Group Radio Access Network; Spreading and Modulation (FDD)(Release 4).
3GPP TS 25.211 V4.2.0 (Sep. 2001) 3rd Generation Partnership Project; Technical Specification Group Radio Access Network; Physical Channels and Mapping of Transport Channels Onto Physical Channels (FDD)(Release 4).
3GPP TS 25.212 V4.2.0 (Sep. 2001) 3rd Generation Partnership Project; Technical Specification Group Radio Access Network; Multiplexing and Channel Coding (FDD)(Release 4).
3GPP TS 25.214 V4.2.0 (Sep. 2001) 3rd Generation Partnership Project; Technical Specification Group Radio Access Network; Physical Layer Procedures (FDD)(Release 4).
3GPP2 C.S0002-0 Version 1.0 (Jul. 1999) 3rd Generation Partnership Project 2 "3GPP2" Physical Layer Standard for cdma2000 Spread Spectrum Systems.
Al-Tawil, "A New Authentication Protocol for Roaming Users in GSM", Proceedings for IEEE International Symposium on Computers and Communication, Jul. 6, 1999, pp. 93-99.
B.G. Marchent et al. "Intelligent Control of Mobile Multimedia Systems" Vehicular Technology Conference 1998. VTC 98, 48th IEEE Ottawa, Canada, May 18-21, 1998; New York, USA, May 18, 1998, pp. 2047-2051.
Baccelli, F et al: "Self Organizing Hierarchical Multicast Trees and Their Optimization," Infocom 1999. IEEE, 1081-1089 (Mar. 21, 1999).
Berkovits, S. "How to Broadcast a Secret" Advances in Cryptology, Eurocrypt, International Conference on the Theory and Application of Cryptographic Techniques, Springer-Verlag, Delaware, Apr. 11, 1991, pp. 535-541.
Bormann, C., et al. "Robust Header Compression (ROHC)" Internet Draft, Dec. 2000, pp. 1-122, XP002901751 (pp. 4-5).
Bormann, et al., "Robust Header Compression (ROHC)," Internet Engineering Task Force IETF Draft, 1-145, Feb. 26, 2001.
Brown: "The Electronic Post It Note Model for Mobile Computing Applications," Computing Lab, The University, Canterbury, Kent, The Institution of Electrical Engineers, IEEE, Savoy Place, London, WC2R OBL, UK.
Estrin, et al., "The Protocol Independent Multicast-Sparse Mode (PIM-SM)," RFC 2362, Jun. 1998.
ETSI TR 125 925 V3.3.0: "Universal Mobile Telecommunications System (UMTS); Radio Interface for Broadcast/Multicast Services (3GPP TR 25.925 version 3.3.0 Release 1999)," XP002230388, pp. 1-35, (Dec. 2000).
ETSI:"Universal Mobile Telecommunications Systems (UMTS); Multimedia Broadcast/Multicast Service (MBMS); Stage 1, 3GPP TS 22.146 version 5.2.0 Release 5", ETSI TS 22.146 v5.2.0, pp. 1-15, Mar. 2002.
Farinacci, D., et al., "Generic Routing Encapsulation (GRE)," Network Working Group Request for Comments 2784, 1-8, Mar. 2000. URL:http://www.globecom.net/ieft/rfc/rfc2784.html (retrieved on Feb. 14, 2003).
Foldoc, "Spread-spectrum communications", definition, dated Aug. 8, 2001, from http://foldoc.org/index.cgi?query=spread+spectrum.
Gong, L et al: "Trade-Offs in Routing Private Multicast Traffic," Global Telecommunications Conference, 1995. IEEE, 2124-2128 (Nov. 13, 1995).
Greg Rose et al., "The Secure Real Time Transport Protocol," Internet Draft, Feb. 2001, pp. 1-26.
Handley, M et al., "SDP: Session Description Protocol" Network Working Group, Request for Comments: 2327, Category: Standards Track. ISI/LBNL, Apr. 1998, pp. 1-42.
IEEE. "IEEE STD. 802.11, Part 11; Wireless LAN Medium Access Control (Mac) and Physical Layer (PHY) Specifications" 1997, pp. 60-70.
Jalali, A., et al. "Data Throughput of CDMA-HDR a High Efficiency-High Data Rate Personal Communication Wireless System," 2000 IEEE, pp. 1854-1858.
Jou, Y. "Developments in Third Generation (3G) CDMA Technology," 2000 IEEE, pp. 460-464.
Kalliokulju J.: "User Plane Architecture of 3rd Generation Mobile Telecommunication Network," IEEE International Conference on Networks, ICON, Proceedings on Networks (ICON'99), Sep. 28, 1999-Oct. 1, 1999, pp. 270-278, XP010354980.
Keeler, Robert E., "Interoperability Considerations for Digital HDTV," IEEE Transactions on Broadcasting, vol. 37, No. 4, Dec. 1991, pp. 128-130.
Lin, et al: "A Multicast Routing Protocol for Multihop Wireless Networks," Dept. of Computer Science and Information Engineering, Chung Cheng University, Taiwan, Global Telecommunications Conference, XP010373304.
Linuxguruz,: "Free On-Line Dictionary of Computing", § Internet Protocol, Dec. 2000.
Lou et al., "Progressive Video Streaming Over 2G and 3G Wireless Systems," Proceedings of the 11th IEEE International Symposium on Personal Indoor and Mobile Radio Communications, vol. 2, Sep. 18-21, 2000, London, pp. 1550-1554.
Macq. Benoit M et al. "Cryptology for Digital TV Broadcasting", 1995 IEEE.
Marchent, B.G., et al. "Intelligent Control of Mobile Multimedia Systems" Vehicular Technology Conference 1998. VTC 98, 48th IEEE Ottawa, Canada, May 18-21, 1998; New York, USA, May 18, 1998, pp. 2047-2051.
Menezes et al.: "Key Layering and Cryptoperiods," Passage, Handbook of Applied Cryptography, CRC Press Series on Discrete Mathematics and its Applications, Boca Raton, FL, CRC Press, US, 1997, pp. 551-553, 557-581.
Menezes, A et al.: "Handbook of Applied Cryptography" 1997, CRC Press LIC, USA XP002248262 pp. 497-500, 551-552.
Menezes, A et al.: "Handbook of Applied Cryptography," Chapter 13, pp. 543-590, CRC Press (1996).
Miyazaki: "A Stream-data Multicast Protocol Using IP Unicast Address" Technical Report of IEICE, IN2001-9, May 11, 2001.
Mooij, W.: "Advances in Conditional Access Technology", IEEE, pp. 461-464 (Sep. 1997).
Moy, "Multicast Extensions to OSPF," RFC 1584, Mar. 1994.
Paul K et al: "A Stability-Based Distributed Routing Mechanism to Support Unicast and Multicast Routing in Ad Hoc Wireless Network" Computer Communications, Elsevier Science Publishers BV, Amsterdam, NL, vol. 24, No. 18, Dec. 1, 2001, pp. 1828-1845, XP0043.
Schneier, B.: "Applied Cryptography, Conference Key Distribution and Secret Broadcasting" Second Edition, pp. 520, 523-524, John Wiley & Sons, Inc. XP002248263 (1996).
Schneier, B.: "Applied Cryptography," Second Edition, pp. 170, 171, 173, John Wiley & Sons, Inc. (1996).
Schneier, B.: "Applied Cryptography," Second Edition, pp. 182-184, John Wiley & Sons, Inc. (1996).
Shannon, C.E., "A Mathematical Theory of Communication," The Bell System Technical Journal, vol. 27, pp. 379-423, 623-656, July, Oct. 1948.
Simpson, W., "PPP in HDLC-Like Framing," Network Working Group, Request for Comments: 1662 (RFC 1662), Jul. 1994, pp. 1-17.
Stallings, W.: "Cryptography and network security" 1995, Prentice-Hall, Inc., XP002248261 pp. 402-406, 413-417, 421-424.
Takahashi: "Prospect of Push type Information Providing Service/Technology," Information Processing, vol. 39, No. 11, Nov. 15, 1998, p. 1124-1131.
Tanenbaum, Andrew S.: Computer Networks, Third Edition; Pub. 1996; pp. 8, and 179-190.

(56) References Cited

OTHER PUBLICATIONS

Tanenbaum, Andrew S.: Computer Networks; Second Edition; Pub 1993 XP2530414.

TIA/EIA/IS-856 Interim Standard cdma2000 High Rate Packet Data Air Interface Specification (Nov. 2000).

TIA/EIA/IS-95-A (Revision of TIA/EIA/IS-95) Mobile Station—Base Station Compatibility Standard for Dual-Mode Wideband Spread Spectrum Cellular System (May 1995).

Toh C-K et al: "ABAM: On-Demand Associativity-Based Multicast Routing for Ad Hoc Mobile Networks," Vehicular Technology Conference, 2000. IEEE, 987-993 (2000).

Waitzman, et al., "The Distance Vector Multicast Routing Protocol (DVMRP)," RFC 1075, Nov. 1, 1998.

Yamaguchi, S., "Realization of Multimedia Communications", Unix Magazine, AACII Corporation, Jun. 1, 1996, vol. 11, No. 6, pp. 45-53.

Yang et al: "An Efficient Multicast Delivery Scheme to Support Mobile IP," Database and Expert Systems Applications, 1999. IEEE, 638-88 (Sep. 1, 1999).

You Xiaohu, "D&R Progress on China's 3g Mobile Communications", Telecom Science, vol. 2, 2001, pp. 11-17.

International Search Report, PCT/US2002/032052—International Search Authority—European Patent Office, Sep. 10, 2003.

Asaka et al., "Dynamic Multicast Routing Using Predetermined Path Search". Technical Report of IEICE (The Institute of Electronics, Information and Communication Engineers), SSE95-56 IN99-37 CS99-78, Sep. 27, 1999.

Tadaumi, "IP Technology as Communication Infra," The Institute of Electronics Information and Communication Engineers, col. 83, No. 4, Apr. 2000, pp. 286-294.

3GPP TS 25.214 v4.1.0(Jun. 2001) Universal Mobile Telecommunications System (UMTS); Physical layer procedures (FDD), Release 4, ETSI TS 125 214 V4.1.0, Jun. 2001.

Baugher et al: "The Secure Real Time Transport Protocol" Internet Engineering Task Force, AVT Working Froup, Internet-Draft, Jul. 2003, XP002320685.

Haverinen, et al., "EAP SIM Authentication" draft-haver inen-pppext-eap-sim-11 .txt, [online] <URL:http:l/www.watersprings.orglpub/id/draft-haverinen-pppext-eap-sim- 11 .txt> Jun. 2003, pp. 1-64.

JNSA, "Trend of the Latest Security Protocol IPsecH—with Demonstration Experiment Report for Interconnection," Network Magazine, vol. 6, No. 6, Japan, Jun. 2001, vol. 6, pp. 86-93.

Meier J D et al: "Building Secure ASP.NET Applications: Authentication, Authorization, and Secure Communication: Cryptography and Certificates" Microsoft Patterns & Practices, Nov. 2002, pp. 1-5, XP002321827.

Menezes et al., "Handbook of Applied Cryptography." CRC Press. 1996. pp. 195-212.

Okamoto, "Encryption Technology for Realizing a Bright Information Society 5: Management of Encryption Key Distribution", Bit, Japan, Kyoritsu Shuppan Co., Ltd., Nov. 1, 1991, vol. 23, No. 12, pp. 51-59.

Pannetrat, et al, "Authenticating real time packet streams and multicasts", 2002 IEEE. Computers and Communications, 2002. Proceedings. ISCC 2002. Seventh International Symposium on, pp. 490-495.

Pelletier, et al., "Robust Header Compression (ROHC): A Profile for TCP/IP (ROHC-TCP)", Internet Draft, Feb. 21, 2005, pp. 1-2.

Stallings, W.: "Cryptography and network security: Principles and Practice" Second Edition, 1999, Prentice Hall, New Jersey, pp. 400-413.

TIA/EIA/IS-95-B Mobile Station—Base Station Compatibility Standard for Dual-Mode Wideband Spread Spectrum Cellular System (IS-95 Standard), Feb. 3, 1999.

Brown, D., "Techniques for Privacy and Authentication in Personal Communication Systems," IEEE Personal Communications, vol. 2, No. 4, pp. 6-10, Aug. 1995, doi: 10.1109/98.403452.

European Search Report—EP10004607, Search Authority—Munich Patent Office, Nov. 18, 2010.

European Search Report—EP10005810, Search Authority—Munich Patent Office, Nov. 10, 2010.

Haverinen H: "EAP SIM Authentication", 3GPP Draft; S3-010663_Draft-Haverinen-PPPEXT-EAP-SIM-0 2, 3rd Generation Partnership-Project (3GPP), Mobile Competence Centre ; 650, Route Des Lucioles ; F-06921 Sophia-Antipolis Cedex ; France, vol. SA WG3, No. Sophia; Nov. 28, 2001, XP050271835, [retrieved on Nov. 28, 2001].

Supplementary European Search Report—EP04777745, Search Authority—Berlin Patent Office, Dec. 14, 2010.

Taiwanese Search report—093124861—TIPO—Dec. 7, 2010.

Translation of Office Action in Japan Application 2004-531597 corresponding to U.S. Appl. No. 11/626,822, citing JP2002506296, JP2002026835, JP2002152194, JP2000287192, JP20017800, WO0062476, JP7115414, JP7288798, JP10214233, JP11510668, JP2000134193, JP2001134193, JP2001512842, JP2001513587, JP2002027417, JP2002521879, JP2002505458, JP2002232418, WO02061572 and JP2003529963 dated Nov. 24, 2011.

Translation of Office Action in Japan application 2006-518894 corresponding to U.S. Appl. No. 10/870,303, citing JP2002541685, WO0208449, WO2005008393, Dan_Brown_Techniques_pgs_6_10_year_1995 and Haverinen_EAP_SIM_year_2003 dated Mar. 22, 2011.

Translation of Office Action in Japanese Application 2002-577339 corresponding to U.S. Appl. No. 09/933,971 , citing JP11331070, JP2090840, JP2000244603 and JP2000115860 dated Oct. 19, 2010.

Translation of Office Action in Japanese Application 2008-184930 corresponding to U.S. Appl. No. 12/703,099, citing JP2001177564, JP10200536, T. Asaka et. al., T. Miyazaki et. al., WO0156232 and WO0150783 dated Feb. 8, 2011.

Bauer D., et al., "An error-control scheme for a multicast protocol based on round-trip time calculations", Local Computer Networks, 1996., Proceedings 21st IEEE Conference on Minneapolis, MN, USA Oct. 13-16, 1996, Los Alamitos, CA, USA, IEEE Comput. Soc, US, Oct. 13, 1996, pp. 212-221, XP010200690, DOI: 10.1109/LCN.1996.558149 ISBN: 978-0-8186-7617-8 * chapters 3 + 3.1 *.

Chen T., et al.,"cdma2000 Broadcast Services Stage 2: System Design", C10-20010820-008,3GPP2, Aug. 20, 2001.

C.R1001-A, 3GPP2, "Administration of Parameter Value Assignments for cdma2000 Spread Spectrum Standards Release C" Jul. 14, 2000, Version 2.0.

"Feature Story I: Evolution of Cellular Phones," ASCII, Dec. 1, 2000, vol. 24, No. 12, pp. 204.

Menezes Alfred J., et al.,"Handbook of Applied Cryptography," 1997 CRC Press, pp. 169-190.

Mysore J. P., et al., Performance of transport protocols over a multicasting-based architecture for Internet host mobility, Communications, 1998. ICC 98. Conference Record. 1998 IEEE International Conference on Atlanta, GA, USA Jun. 7-11, 1998, New York, NY, USA, IEEE, US, vol. 3, Jun. 7, 1998, pp. 1817-1823, XP010284635, DOI: 10.1109/ICC. 1998.683142 ISBN: 978-0-7803-4788-5 * abstract * * chapter 2 *.

Ohnishi H., et al., "Proposed Scheme for Route Optimization on the Mobile IP Network," Technical Report of the Institute of Electronics, Information and Communication Engineers, SSE99-123 PS99-47, Dec. 17, 1999.

Qualcomm Europe: "MBMS Security Framework", 3GPP TSG SA WG3 Security—S3 #29 S3-030356, Jul. 2003, MBMS Security and 3GPP-3GPP2 joint meeting.

Romkey J., "A Nonstandard for Transmission of IP Datagrams Over Serial Lines: SLIP", rfc1055, IETF, Jun. 1988, URL, http://www.ietforg/rfc/rfc1055.txt.

Sinnarajah R., "Signaling Support for Broadcast Service", 3GPP2 TSG-C Contribution, 2002, C20-20020107-022, URL http://ftp.3gpp2.org /TSGC/Working/2002/TSG-C-0201/TSG-C-0201-Vancouver/WG2/C20-20020107-020 (Signaling-Support-for-Broadcast-Service).doc.

Yajnik M., et al., "Packet loss correlation in the MBone multicast network", Global Telecommunications Conference, 1996. GLOBECOM '96. 'Communications: The Key to Global Prosperity London, UK Nov. 18-22, 1996, New York, NY, USA, IEEE, US, Nov. 18, 1996, pp. 94-99, XP010220159, DOI: 10.1109/GLOCOM. 1996. 586133 ISBN: 978-0-7803-3336-9 * chapter 3.1 *.

(56) References Cited

OTHER PUBLICATIONS

Haverinen, H., "GSM SIM Authentication and Key Generation for Mobile IP"; draft-haverinen-mobileip-gsmsim-01.txt; Internet Engineering Task Force, IETF, CH; Nov. 2000; XP015014135.

Momona, M., et al., "Technologies and Standardization Activities in Cable TV Access Networks," IEICE Technical Report, Japan. The Institute of Electronics, Information and Communication Engineers (IEICE), Feb. 15, 1999. vol. 98, No. 589: pp. 57-64.

* cited by examiner

METHOD AND SYSTEM FOR REDUCTION OF DECODING COMPLEXITY IN A COMMUNICATION SYSTEM

CLAIM OF PRIORITY UNDER 35 U.S.C. §120

The present Application for Patent is a Continuation and claims priority to patent application Ser. No. 09/976,591 entitled "METHOD AND SYSTEM FOR REDUCTION OF DECODING COMPLEXITY IN A COMMUNICATION SYSTEM" filed Oct. 12, 2001, now U.S. Pat. No. 7,649,829, issued Jan. 19, 2010, and assigned to the assignee hereof and hereby expressly incorporated by reference herein.

BACKGROUND

1. Field

The present invention relates to communication systems. More particularly, the present invention relates to a system and method for reduction of decoding complexity in a communication system.

2. Background

Communication systems have been developed to allow transmission of information signals from an origination station to a physically distinct destination station. In transmitting information signal from the origination station over a communication channel, the information signal is first converted into a form suitable for efficient transmission over the communication channel. Conversion, or modulation, of the information signal involves varying a parameter of a carrier wave in accordance with the information signal in such a way that the spectrum of the resulting modulated carrier is confined within the communication channel bandwidth. At the destination station the original information signal is replicated from the modulated carrier wave received over the communication channel. Such a replication is generally achieved by using an inverse of the modulation process employed by the origination station.

Modulation also facilitates multiple-access, i.e., simultaneous transmission and/or reception, of several signals over a common communication channel. Multiple-access communication systems often include a plurality of subscriber units requiring intermittent service of relatively short duration rather than continuous access to the common communication channel. Several multiple-access techniques are known in the art, such as time division multiple-access (TDMA), frequency division multiple-access (FDMA), and amplitude modulation multiple-access (AM). Another type of a multiple-access technique is a code division multiple-access (CDMA) spread spectrum system that conforms to the "TIA/EIA/IS-95 Mobile Station-Base Station Compatibility Standard for Dual-Mode Wide-Band Spread Spectrum Cellular System," hereinafter referred to as the IS-95 standard. The use of CDMA techniques in a multiple-access communication system is disclosed in U.S. Pat. No. 4,901,307, entitled "SPREAD SPECTRUM MULTIPLE-ACCESS COMMUNICATION SYSTEM USING SATELLITE OR TERRESTRIAL REPEATERS," and U.S. Pat. No. 5,103,459, entitled "SYSTEM AND METHOD FOR GENERATING WAVEFORMS IN A CDMA CELLULAR TELEPHONE SYSTEM," both assigned to the assignee of the present invention.

A multiple-access communication system may be a wireless or wire-line and may carry voice and/or data. An example of a communication system carrying both voice and data is a system in accordance with the IS-95 standard, which specifies transmitting voice and data over the communication channel. A method for transmitting data in code channel frames of fixed size is described in detail in U.S. Pat. No. 5,504,773, entitled "METHOD AND APPARATUS FOR THE FORMATTING OF DATA FOR TRANSMISSION", assigned to the assignee of the present invention. In accordance with the IS-95 standard, the data or voice is partitioned into code channel frames that are 20 milliseconds wide with data rates as high as 14.4 Kbps. Additional examples of a communication systems carrying both voice and data comprise communication systems conforming to the "3rd Generation Partnership Project" (3GPP), embodied in a set of documents including Document Nos. 3G TS 25.211, 3G TS 25.212, 3G TS 25.213, and 3G TS 25.214 (the W-CDMA standard), or "TR-45.5 Physical Layer Standard for cdma2000 Spread Spectrum Systems" (the IS-2000 standard).

An example of a data only communication system is a high data rate (HDR) communication system that conforms to the TIA/EIA/IS-856 industry standard, hereinafter referred to as the IS-856 standard. This HDR system is based on a communication system disclosed in co-pending application Ser. No. 08/963,386, entitled "METHOD AND APPARATUS FOR HIGH RATE PACKET DATA TRANSMISSION," filed Nov. 3, 1997, now U.S. Pat. No. 6,574,211, issued Jun. 3, 2003, and assigned to the assignee of the present invention. The HDR communication system defines a set of data rates, ranging from 38.4 kbps to 2.4 Mbps, at which an access point (AP) may send data to a subscriber station (access terminal, AT). Because the AP is analogous to a base station, the terminology with respect to cells and sectors is the same as with respect to voice systems.

In a multiple-access communication system, communications between users are conducted through one or more base stations. A first user on one subscriber station communicates to a second user on a second subscriber station by transmitting data on a reverse link to a base station. The base station receives the data and can route the data to another base station. The data is transmitted on a forward link of the same base station, or the other base station, to the second subscriber station. The forward link refers to transmission from a base station to a subscriber station and the reverse link refers to transmission from a subscriber station to a base station. Likewise, the communication can be conducted between a first user on one subscriber station and a second user on a landline station. A base station receives the data from the user on a reverse link, and routes the data through a public switched telephone network (PSTN) to the second user. In many communication systems, e.g., IS-95, W-CDMA, IS-2000, the forward link and the reverse link are allocated separate frequencies.

The above described wireless communication service is an example of a point-to-point communication service. In contrast, broadcast services provide point-to-multipoint communication service. The basic model of a broadcast system consists of a broadcast net of users served by one or more central stations, which transmit information with a certain contents, e.g., news, movies, sports events and the like to the users. Each broadcast net user's subscriber station monitors a common broadcast forward link signal. Because the central station fixedly determines the content, the users are generally not communicating back. Examples of common usage of broadcast services communication systems are TV broadcast, radio broadcast, and the like. Such communication systems are generally highly specialized purpose-build communication systems. With the recent, advancements in wireless cellular telephone systems there has been an interest of utilizing the existing infrastructure of the—mainly point-to-point cellular telephone systems for broadcast services. (As used herein, the term "cellular" systems encompasses communication systems utilizing both cellular and PCS frequencies.)

The information signal to be exchanged among the terminals in a communication system is often organized into a plurality of packets. For the purposes of this description, a packet is a group of bytes, including data (payload) and control elements, arranged into a specific format. The control elements comprise, e.g., a preamble and a quality metric. The quality metric comprises, e.g., cyclical redundancy check (CRC), parity bit(s), and other types of metric known to one skilled in the art. The packets are then formatted to fit a into a frame in accordance with a communication channel structure. The frame, appropriately modulated, traveling between the origination terminal and the destination terminal, is affected by characteristics of the communication channel, e.g., signal-to-noise ratio, fading, time variance, and other such characteristics. Such characteristics affect the modulated signal differently in different communication channels. Consequently, transmission of a modulated signal over a wireless communication channel requires different considerations than transmission of a modulated signal over a wire-like communication channel, e.g., a coaxial cable or an optical cable. In addition to selecting modulation appropriate for a particular communication channel, other methods for protecting the information signal have been devised. Such methods comprise, e.g., encoding, symbol repetition, interleaving, and other methods know to one of ordinary skill in the art. However, these methods increase overhead. Therefore, an engineering compromise between reliability of the information signal delivery and the amount of overhead must be made. Even with the above-discussed protection of information signal, the conditions of the communication channel can degrade to the point at which the destination station possibly cannot decode (erases) some of the packets. In data-only communications systems allowing a communication of a feedback from a destination terminal to the origination terminal, one cure is to re-transmit the non-decoded packets using an Automatic Retransmission reQuest (ARQ) made by the destination station to the origination station. However, under certain conditions, the ARQ may overload the communication system. Furthermore, as discussed in regards to broadcast communication systems, the subscribers do not communicate back to the base station. Consequently, other means of information protection are desirable.

A co-pending application Ser. No. 09/933,912, entitled "METHOD AND SYSTEM FOR UTILIZATION OF AN OUTER DECODER IN A BROADCAST SERVICES COMMUNICATION SYSTEM," filed Aug. 20, 2001, and assigned to the assignee of the present invention, discussed in detail utilization of an outer decoder in a broadcast system. As described in the co-pending application Ser. No. 09/933,912, the bit stream of information to be transmitted is first encoded by an outer decoder and the encoded stream is then encoded by an inner encoder. As illustrated in FIG. 1, the bit stream of information to be transmitted 102, originating at higher layers, is provided to a transmit buffer 104. The transmit buffer is illustrated in more detail in FIG. 2. Referring to FIG. 2, the bits fill the systematic portion 204(1) of the transmit buffer 104 (of FIG. 1) row by row from left to right. The systematic portion 204(1) comprises k rows 208 of length L. Referring back to FIG. 1, once the systematic portion 204(4) (of FIG. 2) is full, the outer block encoder 106 is activated to perform column-wise encoding of the bits in the systematic portion 204(1) (of FIG. 2) to generate (n-k) additional rows 210 (of FIG. 2) of parity bits. This column-wise operation is performed column by column for binary outer code, i.e., m=1. For non-binary code, i.e., m>1, every m adjacent columns in a row are treated as a m-bit symbol. The m-bit symbols along the top k rows are read by the outer encoder to produce n-k m-bit symbols that fill the corresponding lower n-k rows of these columns.

The outer encoder comprises, e.g., a systematic Reed-Solomon (R-S) encoder. Referring back to FIG. 1, the content of the transmit buffer 104 is then provided to a physical layer 108. At the physical layer 108, the individual frames are encoded by an inner encoder 198, which results in encoded frames. The structure of the inner decoder may is well known to one of ordinary skills in the art. The systematic rows and the parity rows of the buffer may be interlaced during transmission to reduce the chance of large number of systematic rows erased when the total number of inner code erasure exceeds the outer code's correcting capability. The frames are further processed in accordance with a selected modulation scheme, e.g., cdma2000, WCDMA, UMTS, and other modulation schemes known to one of ordinary skills in the art. The processed frames are then transmitted over a communication channel 110.

The transmitted frames are received at the destination station and provided to a physical layer 112. At the physical layer 112, the individual frames are demodulated and provided to an inner decoder 199. The inner decoder decodes each frame, and if the decoding is successful, outputs a correctly decoded frame; or if the decoding is unsuccessful, declares an erasure. The success or failure of decoding must be determined with a high accuracy, achieved e.g., by including a long (for example, 16-bit) cyclic redundancy check (CRC) in the frame after outer encoding and before inner encoding. The included CRC obtained from the decoded frame is compared with a CRC calculated from the bits of the decoded frame, and if the two CRCs are identical, the decoding is declared successful.

If the inner decoder cannot decode the frame, the decoder declares an erasure, and provides an outer block decoder 116 with an indication that the frame is missing. The process continues until there are as many parity frames received correctly and passed to a parity portion 114(2) of a receive buffer 114, as there are erased systematic frames. The receiver stops the reception of any remaining frames and the outer decoder (not shown) is activated to recover the erased systematic frames. The recovered systematic frames are passed to the upper layer.

It is well known in the art that a decoding/error correcting computation complexity increases with increased values of the number of rows in the transmit buffer 104. Because the decoding/error correcting computation complexity affects hardware complexity at the receiving terminal as well as power consumption, there exists a need in the art for a method and system.

SUMMARY

Embodiments disclosed herein address the above stated needs by providing a method and a system executing the method by encoding systematic bits in each of a plurality of buffers with an outer code; multiplexing content of the plurality of buffers; and encoding said multiplexed content with an inner code to provide a set of frames.

In another aspect of the invention, the received set of frames is decoded by an inner decoder; the correctly decoded frames are de-multiplexed to a plurality of buffers; and the content of each buffer is further processed. If the systematic portion of a buffer has been decoded correctly, the processing comprises providing the content of the systematic portion to higher layers. Alternatively, if it is determined that decoding of the buffer content by an outer decoder recovers the systematic portion, the outer decoder is activated and the recovered content together with the correctly received content of the systematic portion are provided to higher layers.

DETAILED DESCRIPTION

Definitions

Figure 1:
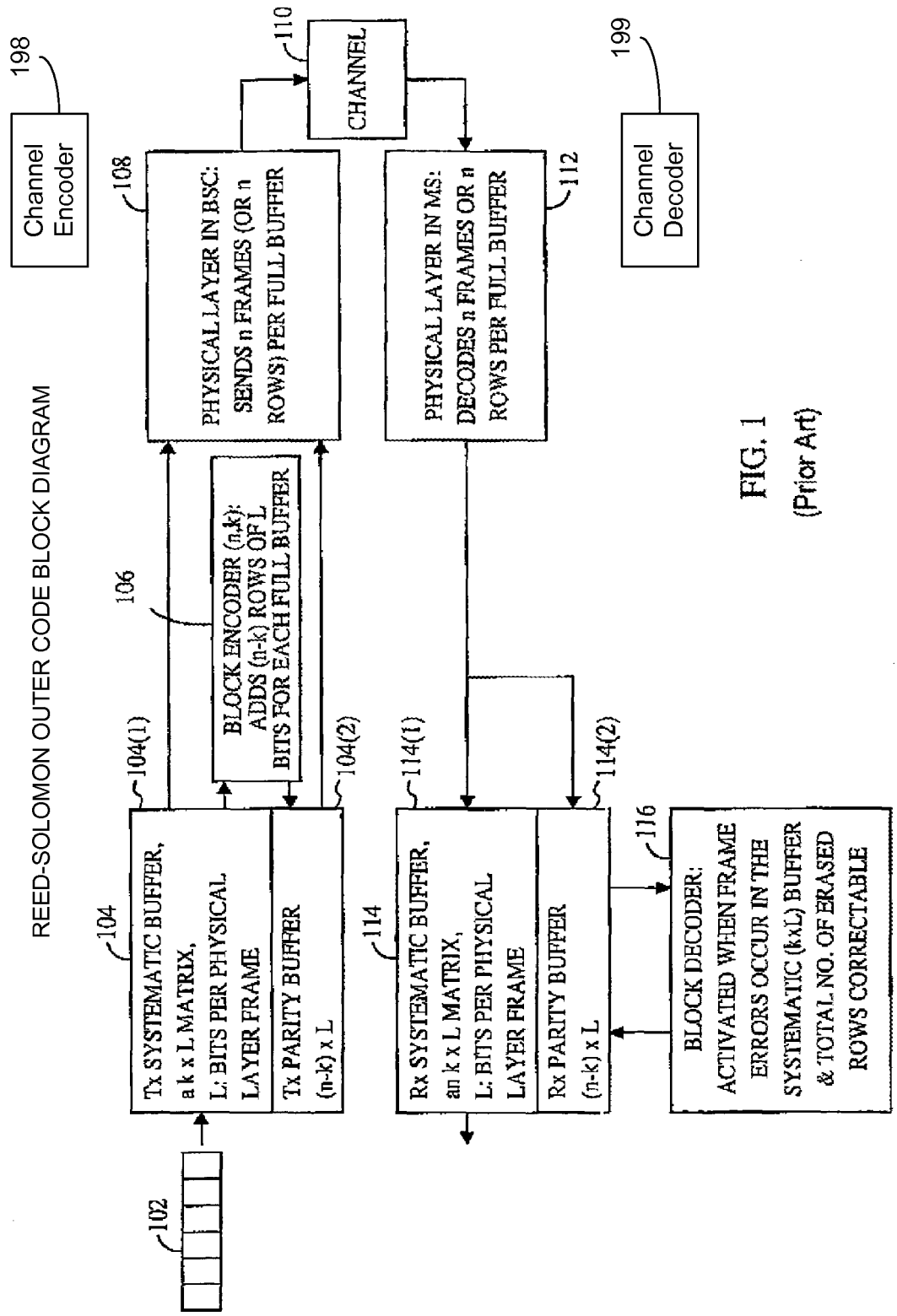
FIG. 1 illustrates prior art physical layer processing.
Figure 2:
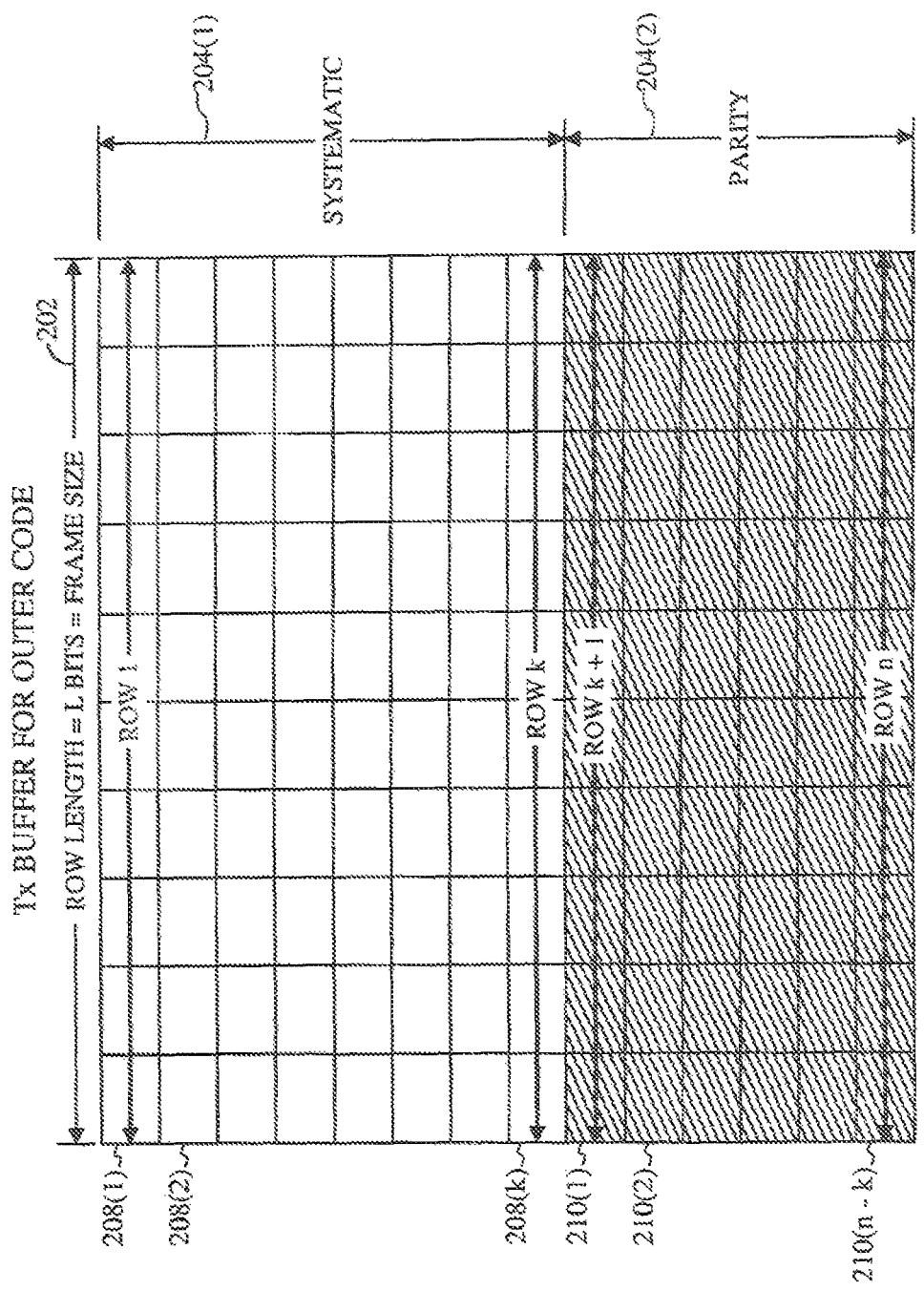
FIG. 2 illustrates a transmit buffer.

The word "exemplary" is used herein to mean "serving as an example, instance, or illustration." Any embodiment described herein as "exemplary" is not necessarily to be construed as preferred or advantageous over other embodiments.

The terms point-to-point communication is used herein to mean a communication between two subscriber stations over a dedicated communication channel.

The terms broadcast communication or point-to-multipoint communication are used herein to mean a communication wherein a plurality of subscriber stations are receiving communication from one source.

The term packet is used herein to mean a group of bits, including data (payload) and control elements, arranged into a specific format. The control elements comprise, e.g., a preamble, a quality metric, and others known to one skilled in the art. Quality metric comprises, e.g., a cyclical redundancy check (CRC), a parity bit, and others known to one skilled in the art.

The term access network is used herein to mean a collection of base stations (BS) and one or more base stations' controllers. The access network transports data packets between multiple subscriber stations. The access network may be further connected to additional networks outside the access network, such as a corporate intranet or the Internet, and may transport data packets between each access terminal and such outside networks.

The term base station is used herein to mean the hardware with which subscriber stations communicate. Cell refers to the hardware or a geographic coverage area, depending on the context in which the term is used. A sector is a partition of a cell. Because a sector has the attributes of a cell, the teachings described in terms of cells are readily extended to sectors.

The term subscriber station is used herein to mean the hardware with which an access network communicates. A subscriber station may be mobile or stationary. A subscriber station may be any data device that communicates through a wireless channel or through a wired channel, for example using fiber optic or coaxial cables. A subscriber station may further be any of a number of types of devices including but not limited to PC card, compact flash, external or internal modem, or wireless or wireline phone. A subscriber station that is in the process of establishing an active traffic channel connection with a base station is said to be in a connection setup state. A subscriber station that has established an active traffic channel connection with a base station is called an active subscriber station, and is said to be in a traffic state.

The term physical channel is used herein to mean a communication route over which a signal propagates described in terms of modulation characteristics and coding.

The term logical channel is used herein to mean a communication route within the protocol layers of either the base station or the subscriber station.

The term communication channel/link is used herein to mean a physical channel or a logical channel in accordance with the context.

The term reverse channel/link is used herein to mean a communication channel/link through which the subscriber station sends signals to the base station.

A forward channel/link is used herein to mean a communication channel/link through which a base station sends signals to a subscriber station.

The term soft hand-off is used herein to mean a communication between a subscriber station and two or more sectors, wherein each sector belongs to a different cell. The reverse link communication is received by both sectors, and the forward link communication is simultaneously carried on the two or more sectors' forward links.

The term softer hand-off is used herein to mean a communication between a subscriber station and two or more sectors, wherein each sector belongs to the same cell. The reverse link communication is received by both sectors, and the forward link communication is simultaneously carried on one of the two or more sectors' forward links.

The term erasure is used herein to mean failure to recognize a message.

The term dedicated channel is used herein to mean a channel modulated by information specific to an individual subscriber station.

The term common channel is used herein to mean a channel modulated by information shared among all subscriber stations.

The term physical layer is used exclusively herein to mean that part of the communication protocol between an origination terminal and a destination terminal that is responsible for the transmission an reception of data. The physical layer corresponds to Layer 1 in the International Standards Organization model for Open System Interconnection.

The term higher layer(s) is used exclusively herein to mean that part of the communication protocol between an origination terminal and a destination terminal that is above a physical layer. The higher layers correspond to Layers 2 through 7 in the International Standards Organization model for Open System Interconnection.

Description

Figure 3:
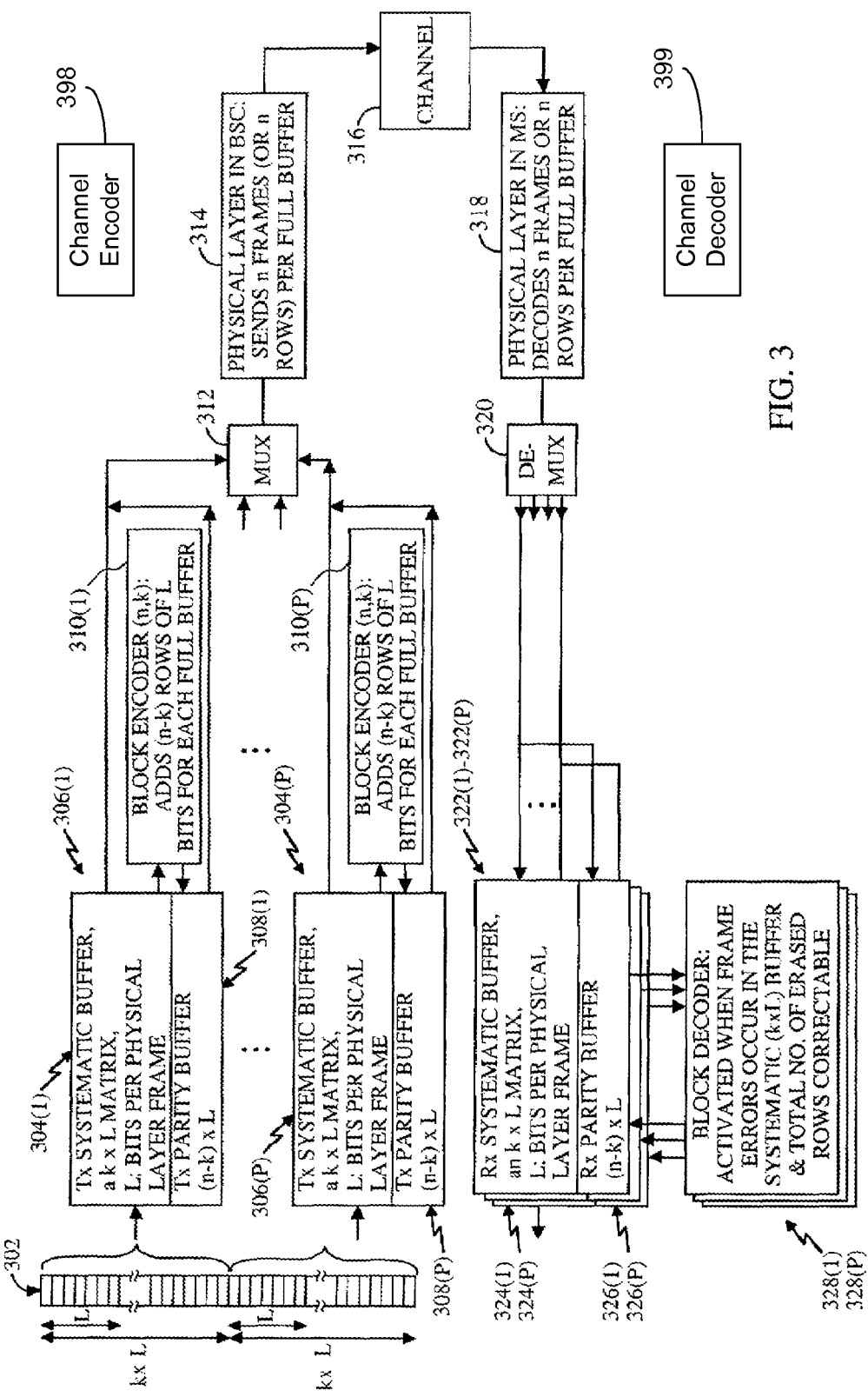
FIG. 3 illustrates physical layer processing in accordance with one embodiment of the invention.

In accordance with one embodiment of the present invention, as illustrated in FIG. 3, the bit stream of information to be transmitted 302, originating at higher layers, is de-multiplexed and provided to transmit buffers 304($i$). The bits fill the systematic portion 306(1) of the transmit buffer 304(1) row by row from left to right. The systematic portion 306(1) comprises k rows of length L. In one embodiment, the length L of the buffer coincides with the length of a radio frame without the overhead (e.g., CRC to help the inner decoder and the tail bits for the inner encoder). Once the systematic portion 306(1) of the transmit buffer 304(1) is full, the procedure is repeated for the remaining transmit buffers 304(2)-304($p$). Once the systematic portions 306($i$) of the transmit buffers 304($i$) are full, the outer block encoders 310($i$) are activated to perform column-wise encoding of the bits in the systematic portion 306($i$) to generate (n-k) additional rows of parity bits 308($i$). This column-wise operation is performed column by column for binary outer code, i.e., m=1. For non-binary code, i.e., m>1, every m adjacent columns in a row are treated as a m-bit symbol. The m-bit symbols along the top k rows are read by the outer encoder to produce n-k m-bit symbols that fill the corresponding lower n-k rows of these columns.

In another embodiment, the length L of the buffer is equal to the number of bits the radio frame without the overhead divided by m, the dimension of the outer encoder code. In this embodiment, the first m rows from the transmit buffers 304(i) are sent in the first radio frame, the second m rows of bits are sent in the second radio frame, until the entire buffer is transmitted. Once the systematic portion 306(1) of the transmit buffer 304(1) is full, the procedure is repeated for the remaining transmit buffers 304(2)-304(p). Once the systematic portions 306(i) of the transmit buffers 304(i) are full, the outer block encoders 310(i) are activated to perform column-wise encoding of the bits in the systematic portion 304(i) to generate m(n-k) additional rows of parity bits 308(i). This column-wise operation is performed column by column for binary outer code, i.e., m=1. For non-binary code, i.e., m>1, every m-rows of a column form a m-bit symbol. The k symbols from the top k m rows in the column are read by the outer encoder to produce (n-k) m-bit symbols that fill the corresponding lower m(n-k) rows of this column.

In one embodiment each of the outer encoders 310(i) comprises a systematic Reed-Solomon (R-S) encoder. The content of the transmit buffers 304(i) are then provided to a multiplexer 312. The multiplexer 312 cycles through the transmit buffers 304(1)-304(p), selecting a successive transmit buffer 304(i) after a block of bits containing a pre-determined number of bits has been sent form a previous buffer 304(i−1). In one embodiment, the pre-determined number of bits in a block equals L. This strategy intends to uniformly distribute corruption of data caused by disturbance of a physical channel 316 among the buffers 304(i). However, one of ordinary skills in the art understands that other multiplexing strategies are equally applicable, and can be utilized without departing from the spirit or scope of the invention. The multiplexed blocks of bits are provided to a physical layer 314 of the originating terminal. At the physical layer 314, additional overhead bits (e.g., a CRC check) are added to each of the blocks of bits, and the resulting structure is encoded by an inner encoder 398, which results in encoded frames. The structure of the outer and inner encoders and the multiplexer may be, e.g., the structure of FIG. 3. The frames are further processed in accordance with a selected modulation scheme. In one embodiment, the processing is performed in accordance with the IS-2000 standard. The processed frames are then transmitted over a communication channel 316.

The transmitted frames are received at the destination station (not shown), and provided to a physical layer 318 at the destination station. At the physical layer 318, the individual frames are demodulated and provided to an inner decoder 399. In one embodiment, the inner decoder decodes each frame, and if the decoding is successful, outputs a correctly decoded frame; or if the decoding is unsuccessful, declares an erasure. The success or failure of decoding must be determined with a high accuracy. In one embodiment, the accuracy is achieved by including a long (for example, 16-bit) cyclic redundancy check (CRC) in the frame after outer encoding and before inner encoding as discussed above. However, one of ordinary skills in the art recognizes that other mechanisms for frame quality indication may be used. The included CRC obtained from the decoded frame is compared with a CRC calculated from the bits of the decoded frame, and if the two CRCs are identical, the decoding is declared successful. Further processing at the physical layer proceeds in accordance with the result of the inner decoder decision.

The correctly decoded frames are provided to a de-multiplexer 320 that distributes the correctly decoded frames among the receive buffers 322(i), utilizing an inverse method to the method used for multiplexing. If all the systematic k frames are correctly decoded by the inner decoder for a particular receive buffer 322(i), the systematic frames from the systematic portion 324(i) of the receive buffer 322(i) are provided to higher layers.

If the inner decoder cannot decode the frame, the decoder declares an erasure, and provides the de-multiplexer 324 with an indication that the frame is missing. The de-multiplexer 324 provides the information to the outer block decoder 328(i) communicatively coupled to the received buffer 322(i) to which the frame belonged. The process continues until there are enough systematic frames and correctly received parity frames accumulated in the systematic portion 324(i) and the parity portion 326(i) of the receive buffer 322(i), or until the receive buffer 322(i) is full. The outer decoder (not shown) is then activated to recover the erased systematic frames. The recovered systematic frames are provided to higher layers.

If the total number of correctly received frames in the receive buffer 322(i) is less than k, in accordance with one embodiment the outer decoder is not activated since there is no guarantee that the decoding would be successful. The correctly received systematic frames together with identification of the missing bits are provided to the higher layers. In another embodiment, the receiver uses decoded bits from the inner decoder (which are unreliable as indicated by the failed CRC checks) to recover bits for the systematic bits. In accordance with one embodiment, the receiver decodes the unreliable bits from the inner decoder and finds the most likely codeword. In the another embodiment, the receiver uses measurement of the signal quality of the erased frames in the buffer to choose enough erroneously received frames with the highest signal to noise ratio to form a sub buffer with k rows. The receiver then performs bit flipping (changing a bit value of 0 to a bit value 1 and vice versa at one column at a time) and checks whether the bit flipping resulted in a codeword. In one embodiment, the bit flipping is first performed on the least reliable bits and continues with bits in the order of the bits' increasing reliability. The reliability of a bit may be determined in accordance with inner decoding metrics, e.g., a signal to noise and interference ratio during the frame, like the Yamamoto metric, the re-encoded symbol error rate, re-encoded energy metric, and other metrics known to one of ordinary skills in the art, or the metrics' combinations. If a codeword was not found, the bit flipping continues through all the remaining columns for all the unreliable rows. If a codeword was not found, the bit flipping continues with increased number of bits flipped (that is, changing 2 bits at a time, then 3 bits, until the maximum number of bits), until either a codeword is found or all combinations are exhausted. In another embodiment, the CRC from the unreliable rows are used to check the overall success of the decoding in this situation. The frames are provided to the higher layers only if the CRC from all rows match; otherwise, only bits from reliable rows are provided to the higher layers.

To improve reliability of decoding, in another embodiment, the demodulation and inner decoding are performed for more than k correctly received frames in a buffer. In accordance in yet another embodiment the demodulation and inner decoding are performed for all frames in the buffer. In both embodiments, the outer decoding is performed on the k (or km) rows with the highest quality. The quality may be determined in accordance with inner decoding metrics, e.g., a signal to noise and interference ratio during the frame, like the Yamamoto metric, the re-encoded symbol error rate, re-encoded energy metric, and other metrics known to one of ordinary skills in the art, or the metrics' combinations. Use of quality metrics for quality estimation is disclosed in detail in U.S. Pat. No. 5,751,725 entitled "METHOD AND APPARA- TUS FOR DETERMINING THE RATE OF RECEIVED DATA IN A VARIABLE RATE COMMUNICATIONS SYSTEM" and U.S. Pat. No. 5,774,496 entitled "METHOD AND APPARATUS FOR DETERMINING DATA RATE OF TRANSMITTED VARIABLE RATE DATA IN A COMMUNICATIONS RECEIVER" and both are assigned to the assignee of the present invention.

One skilled in the art will appreciate that the number of transmit buffers 304, consequently, receive buffers 322 is a compromise between processing overhead and amount of potential data loss. A small value of k, resulting in more transmit/receive buffers causes increased processing overhead. On the other hand, a large value of k resulting in less transmit/receive buffers causes the transmit buffer size to increase, which leads to discarding a large block of data if the content of the transmit buffer cannot be recovered due to more than (n-k) row erasures. A large transmit buffer size also increases the memory requirement at the destination terminal.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

What is claimed is:

1. An encoding method, the method comprising:
  encoding systematic bits contained in each of a plurality of buffers (304) with a Reed-Solomon code;
  multiplexing content of the plurality of buffers (304); and
  encoding said multiplexed content with a further code to provide a set of frames;
  wherein each buffer (304) comprises a systematic buffer (306) and the systematic buffers (306) are used
    for storing systematic data before Reed-Solomon encoding, as uncoded data, and
    for storing a systematic portion of the encoded Reed-Solomon code words after Reed-Solomon encoding, such that said multiplexing is performed directly on the buffer content.

2. The method as claimed in claim 1 wherein said multiplexing content of the plurality of buffers (304) comprises:
  providing a block of bits successively from each of the plurality of buffers (304).

3. The method as claimed in claim 2 wherein said systematic buffers comprise rows and columns forming a matrix and said providing a block of bits successively from each of the plurality of buffers (304) comprises:
  providing a block of bits comprising a row of each of the plurality of buffers (304).

4. The method as claimed in claim 1, wherein said buffers are a plurality of transmit buffers (304) and wherein said method further comprises
  transmitting the set of frames;
  decoding received frames by a first decoder;
  de-multiplexing a correctly decoded frame to a plurality of receive buffers (322); and
  processing content of each received buffer (304).

5. The method as claimed in claim 4 wherein said processing content of each receive buffer (322) comprises:
  providing the systematic portion (324) of each buffer to higher layers.

6. The method as claimed in claim 4 wherein said de-multiplexing the correctly decoded frame to a plurality of receive buffers (322) comprises providing a block of bits belonging to a buffer to the buffer.

7. The method as claimed in claim 6 wherein said block of bits comprises a frame decoded by the first decoder.

8. The method as claimed in claim 4 further comprising:
providing indication of an erasure to a second decoder (328) communicatively coupled to the receive buffer (322) that would receive the correctly decoded frame if the frame failed to decode correctly.

9. The method as claimed in claim 8 wherein said processing content of each buffer comprises:
decoding the systematic portion (324) of the buffer by said second decoder when the systematic portion is recoverable; and
providing the systematic portion (324) of each buffer to higher layers.

10. A method for decoding, comprising:
decoding received frames by a first decoder (318) to obtain encoded Reed-Solomon code words contained in the received frames;
de-multiplexing said decoded frames to a plurality of buffers (322); and
processing content of each of the plurality of buffers (322), wherein said processing content comprises decoding a systematic portion (324) of the encoded Reed-Solomon code words stored in the buffer (322) by a second decoder (328) when the systematic portion is recoverable;
wherein each buffer (322) comprises a systematic buffer (324) and the systematic buffers (322) are used
for storing said systematic portion, such that said de-multiplexing is performed directly into the plurality of buffers (322), and
for storing said decoded systematic portion (324), after said systematic portion (324) has been decoded by said second decoder (328).

11. The method as claimed in claim 10 wherein said processing content of each of the plurality of buffers (322) comprises:
providing the systematic portion (324) of each of the plurality of buffers (322) to higher layers.

12. The method as claimed in claim 10 further comprising:
providing indication of an erasure to said second decoder (328) communicatively coupled to the buffer (322) that would receive the correctly decoded frame if the frame failed to decode correctly.

13. The method as claimed in claim 12 wherein said processing content of each of the plurality of buffers (322) comprises:
providing the systematic portion (324) of each of the plurality of buffer to higher layers.

14. An apparatus for encoding, comprising:
a plurality of buffers (304);
a plurality of Reed-Solomon encoders (310), each of said plurality of Reed-Solomon encoders (310) being communicatively coupled to one of said plurality of buffers (304);
a multiplexer (312) communicatively coupled to said plurality of buffers (306); and
an inner encoder communicatively coupled to said multiplexer (312);
wherein each buffer (304) comprises a systematic buffer (306) and the systematic buffers (306) are used
for storing systematic data before Reed-Solomon encoding, as uncoded data, and
for storing a systematic portion of the encoded Reed-Solomon code words after Reed-Solomon encoding, such that said multiplexing is performed directly on the buffer content.

15. The apparatus as claimed in claim 14 wherein each of said plurality of encoders (310) is configured to:
store systematic bits and parity bits (308).

16. The apparatus as claimed in claim 14 wherein each of said plurality of encoders (310) is configured to:
encode systematic bits to provide parity bits (308).

17. The apparatus as claimed in claim 16 wherein each of said plurality of encoders (310) is configured to:
encode the systematic bits with a block code.

18. The apparatus as claimed in claim 14 wherein said multiplexer (312) is configured to:
provide a block of bits successively from each of said plurality of buffers (304) to said inner encoder.

19. The apparatus as claimed in claim 18 wherein said block of bits comprises a row of said buffer (303).

20. The apparatus as claimed in claim 14 wherein said inner encoder is configured to encode a block of bits to be encoded with an inner code.

21. The apparatus as claimed in claim 20 wherein said block of bits to be encoded comprises:
a block of bits received from said multiplexer (312).

22. The apparatus as claimed in claim 14 wherein said buffers are a plurality of transmit buffers (304); said apparatus further comprising:
a first decoder;
a de-multiplexer (320) communicatively coupled to said de-multiplexer (320); and
a plurality of second decoders (328), each of said plurality of second decoders being communicatively coupled to one of said plurality of receive buffers (322).

23. The apparatus as claimed in claim 22 wherein each of said plurality of transmit buffers (304) is configured to:
store systematic bits and parity bits.

24. The apparatus as claimed in claim 22 wherein each of said plurality of second encoders (328) is configured to:
encode the systematic bits with a Reed-Solomon code.

25. The apparatus as claimed in claim 22 wherein said first decoder is configured to:
decode a received frame;
provide a correctly decoded frame, and
provide indication of an erasure if the received frame failed to decode correctly.

26. The apparatus as claimed in claim 22 wherein said de-multiplexer (320) is configured to provide a block of bits belonging to a buffer to the buffer.

27. The apparatus as claimed in 22 wherein said block of bits belonging to a buffer comprises:
a block of bits comprising a frame decoded by said first decoder.

28. The apparatus as claimed in claim 22 wherein each of said plurality of second decoders (328) is configured to:
decode the systematic portion (324) of the buffer by an outer code when the systematic portion is recoverable.

29. The apparatus as claimed in claim 22 wherein each of said plurality of buffers (322) is configured to:
provide the decoded systematic portion (324) of the buffer to higher layers.

30. The apparatus as claimed in claim 22 wherein each of said plurality of second encoders (328) is configured to:
encode systematic bits to provide parity bits.

31. The apparatus as claimed in claim 30 wherein each of said plurality of second encoders (328) is configured to:
encode the systematic bits with a block code.

32. The apparatus as claimed in claim 22 wherein said multiplexer (312) is configured to:
provide a block of bits successively from each of said plurality of transmit buffers (304) to said inner encoder.

33. The apparatus as claimed in claim 32 wherein said block of bits comprises a row of said buffer.

34. The apparatus as claimed in claim 32 wherein said inner encoder is configured to encode a block of bits to be encoded with an inner code.

35. The apparatus as claimed in claim 34 wherein the block of bits to be encoded comprises:
a block of bits received from said multiplexer (312).

36. An apparatus for decoding, comprising:
a first decoder (318) for decoding received frames to obtain encoded Reed-Solomon code words contained in the received frames;
a de-multiplexer (320) communicatively coupled to said first decoder (318) for de-multiplexing the decoded received frames;
a plurality of buffers (322) communicatively coupled to said de-multiplexer (320); and
a plurality of second decoders (328), each of said plurality of second decoders being communicatively coupled to one of said plurality of buffers (322) and is configured to decode a systematic portion (324) of the encoded Reed-Solomon code words in the buffer when the systematic portion is recoverable;
wherein each buffer (322) comprises a systematic buffer (324) and the systematic buffers (322) are used for
storing each systematic portion of the encoded Reed-Solomon code words contained in the received frames, such that said de-multiplexing is performed directly into the plurality of buffers (322) and
storing said decoded systematic portion (324), after said systematic portion (324) has been decoded by said second decoder (328).

37. The apparatus as claimed in claim 36 wherein said first decoder is configured to:
decode a received frame;
provide a correctly decoded frame; and
provide indication of an erasure if the received frame failed to decode correctly.

38. The apparatus as claimed in claim 36 wherein each of said plurality of buffers (322) is configured to:
provide the decoded systematic portion (324) to higher layers.

39. The apparatus claimed in claim 36 wherein said de-multiplexer (320) is configured to provide a block of bits belonging to a buffer to the buffer (322).

40. The apparatus as claimed in claim 39 wherein said block of bits belonging to a buffer comprises:
a block of bits comprising a frame decoded by said first decoder.

41. An apparatus for encoding, comprising:
means for encoding systematic bits contained in each of a plurality of buffers (304) with a Reed-Solomon code;
means for multiplexing content of the plurality of buffers (304); and
means for encoding said multiplexed content with a further code to provide a set of frames;
wherein each buffer (304) comprises a systematic buffer (306) and the systematic buffers (306) are used
for storing systematic data before Reed-Solomon encoding, as uncoded data, and
for storing a systematic portion of the encoded Reed-Solomon code words after Reed-Solomon encoding, such that said multiplexing is performed directly on the buffer content.

42. A non-transitory computer readable medium encoded with a computer program, the computer program comprising instructions executable to:
decode received frames by a first decoder (318) to obtain encoded Reed-Solomon code words contained in the received frames;
de-multiplex said decoded frames to a plurality of buffers (322); and
process content of each of the plurality of buffers (322), wherein said processing content comprises decoding a systematic portion (324) of the encoded Reed-Solomon code words stored in the buffer (322) by a second decoder (328) when the systematic portion is recoverable;
wherein each buffer (322) comprises a systematic buffer (324) and the systematic buffers (322) are used
for storing said systematic portion, such that said de-multiplexing is performed directly into the plurality of buffers (322), and
for storing said decoded systematic portion (324), after said systematic portion (324) has been decoded by said second decoder (328).

* * * * *